United States Patent
Obata et al.

(10) Patent No.: US 9,142,727 B2
(45) Date of Patent: Sep. 22, 2015

(54) SEMICONDUCTOR LIGHT EMITTING DEVICE

(71) Applicant: Kabushiki Kaisha Toshiba, Minato-ku (JP)

(72) Inventors: Susumu Obata, Nonoichi (JP);
Takayoshi Fujii, Yokohama (JP);
Kazuhito Higuchi, Yokohama (JP);
Akihiro Kojima, Nonoichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/445,261

(22) Filed: Jul. 29, 2014

(65) Prior Publication Data
US 2015/0076546 A1    Mar. 19, 2015

(30) Foreign Application Priority Data
Sep. 19, 2013  (JP) .................. 2013-194108

(51) Int. Cl.
*H01L 29/22*    (2006.01)
*H01L 33/40*    (2010.01)
*H01L 33/50*    (2010.01)
(Continued)

(52) U.S. Cl.
CPC ............ *H01L 33/405* (2013.01); *H01L 33/385* (2013.01); *H01L 33/42* (2013.01); *H01L 33/502* (2013.01)

(58) Field of Classification Search
CPC ........... H01L 2924/01322; H01L 2924/12041; H01L 2224/13; H01L 2933/0041; H01L 33/62; H01L 2227/323; H01L 2251/566; H01L 27/15; H01L 27/3258; H01L 31/055; H01L 33/06; H01L 33/08; H01L 33/24
USPC ....................................... 257/98–99
See application file for complete search history.

(56) References Cited

U.S. PATENT DOCUMENTS

2009/0173956 A1    7/2009  Aldaz et al.
2011/0297969 A1*  12/2011  Kojima et al. ................. 257/88
(Continued)

FOREIGN PATENT DOCUMENTS

EP    2 565 944 A2    3/2013
EP    2 565 944 A3    3/2013
(Continued)

OTHER PUBLICATIONS

Extended European Search Report issued Jan. 26, 2015 in Patent Application No. 14180009.4.

*Primary Examiner* — Thanh T Nguyen
(74) *Attorney, Agent, or Firm* — Oblon, McClelland, Maier & Neustadt, L.L.P.

(57) ABSTRACT

According to one embodiment, a semiconductor light emitting device includes a stacked body, first and second electrodes. The stacked body includes a light emitting layer. The first and second electrodes are provided on the stacked body. The device further includes an insulating layer covering the stacked body, a first conversion electrode electrically connected to the first electrode, a second conversion electrode electrically connected to the second electrode (50), and a light blocking body covering a side surface of the stacked body. The first conversion electrode, the second conversion electrode, and the light blocking body include, in a portion contacting with the insulating layer, a member with a reflectance of 80 percent or more for light emitted from the light emitting layer.

20 Claims, 9 Drawing Sheets

(51) Int. Cl.
*H01L 33/42* (2010.01)
*H01L 33/38* (2010.01)

(56) References Cited

U.S. PATENT DOCUMENTS

2011/0297983 A1* 12/2011 Nishiuchi et al. ............ 257/98
2013/0264600 A1* 10/2013 Lee et al. .................... 257/98

FOREIGN PATENT DOCUMENTS

| EP | 2 575 185 A2 | 4/2013 |
|----|--------------|--------|
| JP | 2006-245058  | 9/2006 |
| JP | 2008-205005  | 9/2008 |
| JP | 2011-71272   | 4/2011 |
| JP | 2011-258974  | 12/2011 |

* cited by examiner

US 9,142,727 B2

SEMICONDUCTOR LIGHT EMITTING DEVICE

CROSS-REFERENCE TO RELATED APPLICATIONS

This application is based upon and claims the benefit of priority from Japanese Patent Application No. 2013-194108, filed on Sep. 19, 2013; the entire contents of which are incorporated herein by reference.

FIELD

Embodiments described herein relate generally to a semiconductor light emitting device.

BACKGROUND

A lighting apparatus is being developed using a semiconductor light emitting element such as an LED (light emitting diode). For example, a semiconductor light emitting device that emits white light can be formed by combining a nitride semiconductor LED that emits blue light and a fluorescent substance that absorbs blue light and emits yellow-based light. In such a semiconductor light emitting device, it is important to enhance the extraction efficiency of light emitted from a light emitting layer.

DETAILED DESCRIPTION

Figure 1A:
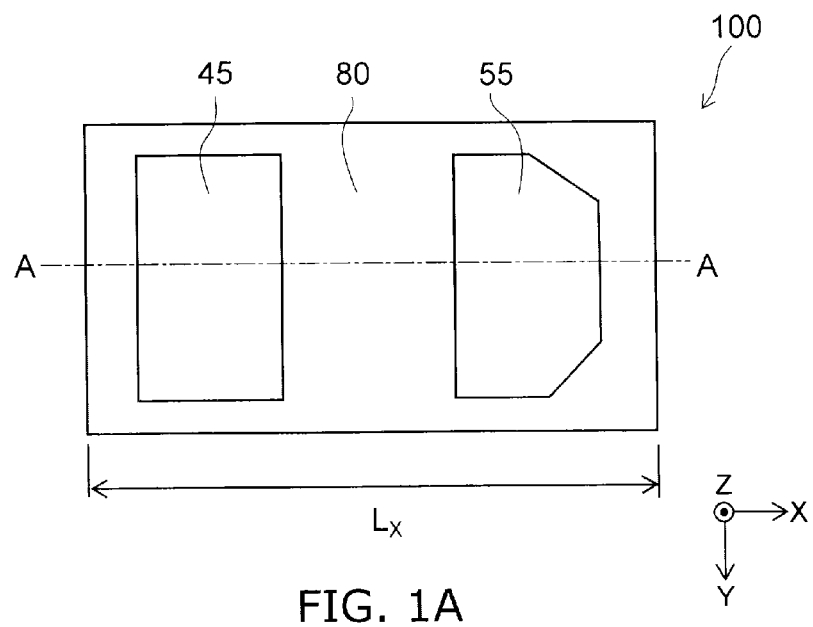
FIG. 1A and FIG. 1B are schematic views illustrating a semiconductor light emitting device according to an embodiment.

According to one embodiment, a semiconductor light emitting device includes a stacked body, first electrode and a second electrode. The stacked body includes a first semiconductor layer of a first conductivity type, a second semiconductor layer of a second conductivity type and a light emitting layer provided between the first semiconductor layer and the second semiconductor layer. The stacked body also includes a first portion and a second portion provided next to the first portion. The first portion includes a part of the first semiconductor layer, the light emitting layer provided on the part of the first semiconductor layer, and the second semiconductor layer provided on the light emitting layer. The second portion of the stacked body includes another part of the first semiconductor layer. The first electrode is provided on the first portion. The second electrode is provided on the second portion on the same side of the stacked body as the first electrode is provided. The device further includes an insulating layer, a first conversion electrode, a second conversion electrode and a light blocking body. The insulating layer covers the stacked body on the side where the first electrode and the second electrode are provided. The insulating layer also covers a side surface around the stacked body. The first conversion electrode is provided on the insulating layer, and is electrically connected to the first electrode. The second conversion electrode is provided next to the first conversion electrode on the insulating layer, and is electrically connected to the second electrode. The light blocking body provided on the side surface of the stacking body via the insulating layer, and surrounding the first conversion electrode and the second conversion electrode. The first conversion electrode, the second conversion electrode, and the light blocking body include, in a portion contacting with the insulating layer, a member having a reflectance of 80 percent or more for light emitted from the light emitting layer.

Various embodiments will be described hereinafter with reference to the accompanying drawings. Identical components in the drawings are marked with the same reference numerals, and a detailed description thereof is omitted as appropriate and different components are described. The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

Figure 1B:
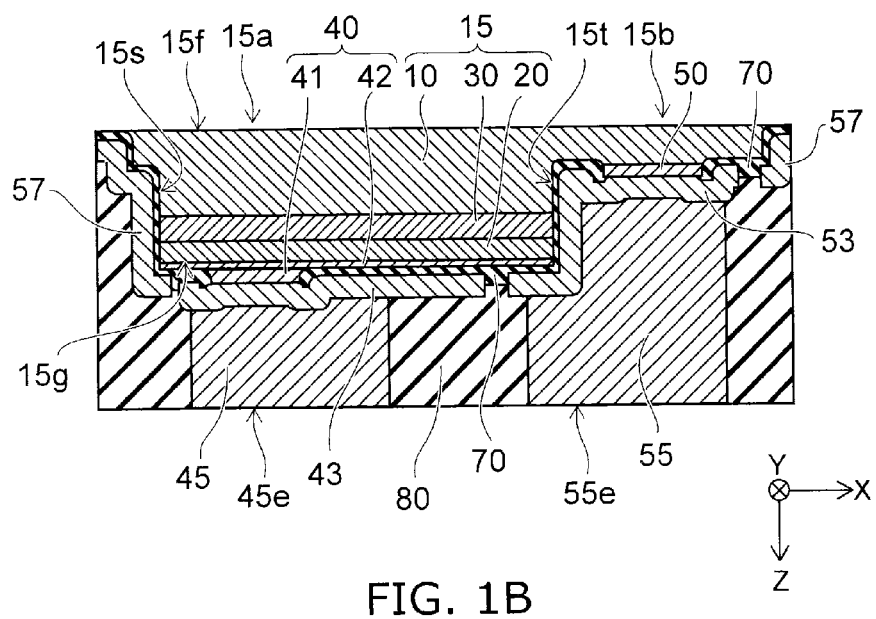

FIG. 1A and FIG. 1B are schematic views illustrating a semiconductor light emitting device 100 according to an embodiment. FIG. 1A is a plan view, and FIG. 1B is a cross-sectional view taken along line A-A of FIG. 1A.

As shown in FIG. 1A and FIG. 1B, the semiconductor light emitting device 100 according to the embodiment includes a stacked body 15, a first electrode 40, a second electrode 50, a first conversion electrode 43, a second conversion electrode 53, a light blocking body 57, a first pillar 45, a second pillar 55, and a sealing body 80.

The stacked body 15 includes a first semiconductor layer 10 of a first conductivity type, a second semiconductor layer 20 of a second conductivity type, and a light emitting layer 30. The stacked body 15 has a first portion 15a and a second portion 15b. The first portion 15a includes a part of the first semiconductor layer 10, the second semiconductor layer 20, and the light emitting layer 30 provided between the part of the first semiconductor layer 10 and the second semiconductor layer 20. The second portion 15b includes a rest part of the first semiconductor layer 10.

Here, the first conductivity type is an n-type, for example, and the second conductivity type is a p-type different from the first conductivity type. The embodiment is not limited thereto, and the p-type may be taken as the first conductivity type and the n-type may be taken as the second conductivity type.

The first semiconductor layer 10, the second semiconductor layer 20, and the light emitting layer 30 include a nitride semiconductor, for example. The first semiconductor layer 10 includes an n-type cladding layer, for example. The second semiconductor layer 20 includes a p-type cladding layer, for example. The light emitting layer 30 includes, for example, a quantum well in which nitride semiconductors of different compositions are stacked.

The stacked body 15 has, for example, a first surface 15*f* and a second surface 15*g* on the opposite side to the first surface 15*f*. The first surface 15*f* is a surface of the first semiconductor layer 10 on the opposite side to the light emitting layer 30. The second surface 15*g* is a surface of the second semiconductor layer 20 on the opposite side to the light emitting layer 30.

Here, a direction from the first semiconductor layer 10 toward the second semiconductor layer 20 is defined as a Z-axis direction (a first direction). One axis perpendicular to the Z-axis is defined as an X-axis (a second axis). The axis perpendicular to the Z-axis and the X-axis is defined as a Y-axis (referred to as a third axis). The Z-axis (a first axis) is perpendicular to the first surface 15*f* and is perpendicular to the second surface 15*g*.

For example, the first semiconductor layer 10, the light emitting layer 30, and the second semiconductor layer 20 are formed in this order on a substrate by crystal growth to form the stacked body 15. Then, a part of the stacked body 15 is removed from the second surface 15*g* side until reaching the first semiconductor layer 10. Thereby, a part of the first semiconductor layer 10 (the second portion 15*b*) is exposed. The light emitting layer 30 and the second semiconductor layer 20 are left in the first portion 15*a*. Thus, the second portion 15*b* is juxtaposed to the first portion 15*a* in the X-Y plane.

The first electrode 40 is provided on the second surface 15*g* side of the second semiconductor layer 20. In this example, the first electrode 40 includes a p-side electrode 41 and a p-side conductive layer 42. The p-side conductive layer 42 is provided on the second semiconductor layer 20 on the second surface 15*g* side. A part of the p-side conductive layer 42 is provided between the p-side electrode 41 and the second semiconductor layer 20.

The second electrode 50 is provided on a surface of the second portion 15*b* of the stacked body 15 on the second surface 15*g* side. That is, the second electrode 50 is provided on the part of the first semiconductor layer mentioned above, which is exposed.

However, the embodiment is not limited thereto, and the p-side conductive layer 42 may not be provided in the first electrode 40. In this case, the p-side electrode 41 is in contact with the second semiconductor layer 20.

The first conversion electrode 43 is electrically connected to the first electrode 40. The second conversion electrode 53 is electrically connected to the second electrode 50. The first conversion electrode 43 and the second conversion electrode are provided for converting an area ratio of the first electrode 40 and the second electrode 50. The light blocking body 57 is provided around the first conversion electrode 43 and the second conversion electrode 53, and covers the outer edge side surface 15*s* of the stacked body 15. The light blocking body 57 is electrically connected to one of the first conversion electrode 43 and the second conversion electrode 53. The light blocking section 57 may be apart from the first conversion electrode 43 and the second conversion electrode 53 so as not to be electrically connected to one of these conversion electrodes. The first conversion electrode 43, the second conversion electrode 53, and the light blocking body 57 are formed, for example, by electroplating.

Figure 3A:
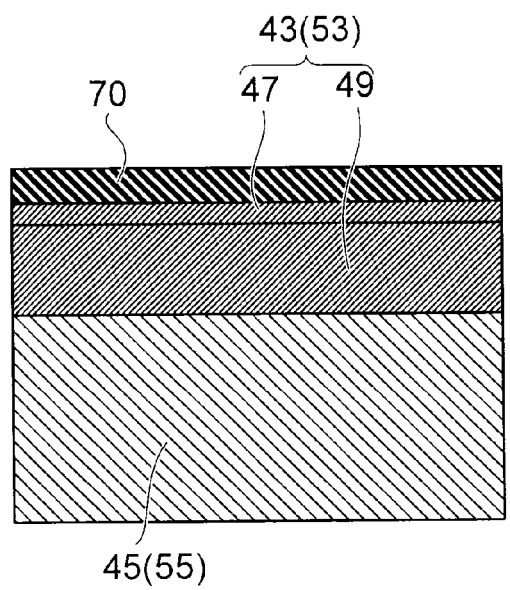
FIG. 3A is a schematic view illustrating the configuration of a part of the semiconductor light emitting device according to the embodiment.

The first conversion electrode 43, the second conversion electrode conversion electrode 53, and the light blocking body 57 include a not-shown plated seed layer 47 (see FIG. 3A). The first conversion electrode 43, the second conversion electrode 53, and the light blocking body 57 include a member that reflects the light emitted from the light emitting layer 30. The conversion electrodes 43 and 53 and the light blocking body 57 include a member having, for example, a reflectance of 80% or more in the light wavelength range from 400 nanometers (nm) to 700 nm, such as aluminum, in the portion contacting with an insulating layer 70.

The stacked body 15 is preferably formed such that the outer edge side surface 15*s* thereof is inclined to the first surface 15*f* side. That is, the stacked body 15 preferably has a tapered outer edge side surface 15*s* that is inclined so that the stacked body is narrower on the second surface 15*g* side than on the first surface 15*f* side. Thereby, light propagated toward the outer edge side surface 15*s* out of the light emitted from the light emitting layer 30 is reflected toward the first surface 15*f* by the light blocking body 57 covering the outer edge side surface 15*s*. Consequently, the light emission efficiency of the light emitting device 100 can be improved. Furthermore, color unevenness caused by light emitted laterally along the first surface 15*f* can be improved.

The first pillar 45 is provided on the first conversion electrode 43, and both are electrically connected. The first pillar 45 extends in the Z-axis direction. The second pillar 55 is provided on the second conversion electrode 53, and both are electrically connected. The second pillar 55 extends in the Z-axis direction.

Although FIGS. 1A and 1B show an example in which one pillar is provided on each conversion electrode, the embodiment is not limited thereto. The number of first pillars 45 provided on the first conversion electrode 43 may be adequately determined. The number of second pillars 55 provided on the second conversion electrode 53 may be adequately determined as well.

The sealing body 80 exposes an end 45*e* of the first pillar 45 and an end 55*e* of the second pillar 55, and covers the first conversion electrode 43, the first pillar 45, the second conversion electrode 53, and the second pillar 55. The end 45*e* of the first pillar 45 is located on the opposite side of the first pillar 45 from the first electrode 40. The end 55*e* of the second pillar 55 is located on the opposite side of the second pillar 55 from the second electrode 50. That is, the sealing body 80 covers the side surface of the first pillar 45 and covers the side surface of the second pillar 55.

The reflectance of the sealing body 80 for the light emitted from the light emitting layer 30 is not more than the reflectance of the first conversion electrode 43, the second conversion electrode 53, and the light blocking body 57. In other words, the reflectance of the first conversion electrode 43, the second conversion electrode 53, and the light blocking body 57 is higher than the reflectance of the sealing body 80. Thereby, light absorbed in the sealing material out of the light emitted from the light emitting layer 30 can be reflected at the first conversion electrode 43, the second conversion electrode, and the light blocking body 57 to be extracted to the outside. That is, the extraction efficiency of light emission of the light emitting layer 30 can be improved.

The semiconductor light emitting device 100 further includes the insulating layer 70. The insulating layer 70 covers the stacked body 15, and the first electrode 40 and the second electrode 50 provided on the stacked body. The reflectance of the insulating layer 70 for the light emitted from the light emitting layer 30 is lower than the reflectance of each conversion electrode and the light blocking body 57. The insulating layer 70 has insulating properties, and includes, for example, a silicon oxide film.

In the example shown in FIG. 1A and FIG. 1B, a length $L_x$ along the X-axis of the semiconductor light emitting device 100 is, for example, about 600 micrometers (μm). A length along the Y-axis is 300 μm, for example. However, the embodiment is not limited thereto, and dimensions of the semiconductor light emitting device 100 are appropriately determined.

As mentioned above, the semiconductor light emitting device 100 includes the first electrode 40 and the second electrode 50 on the second surface 15g side of the stacked body 15, and the light emission of the light emitting layer 30 is extracted from the first surface 15f.

Figure 2A:
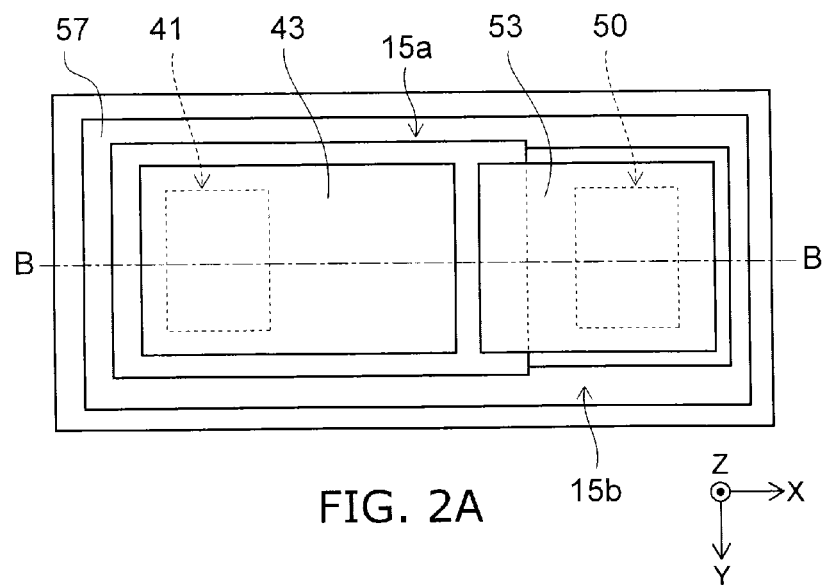
FIG. 2A and FIG. 2B are schematic views illustrating the configuration of the semiconductor light emitting device according to the embodiment.
Figure 2B:
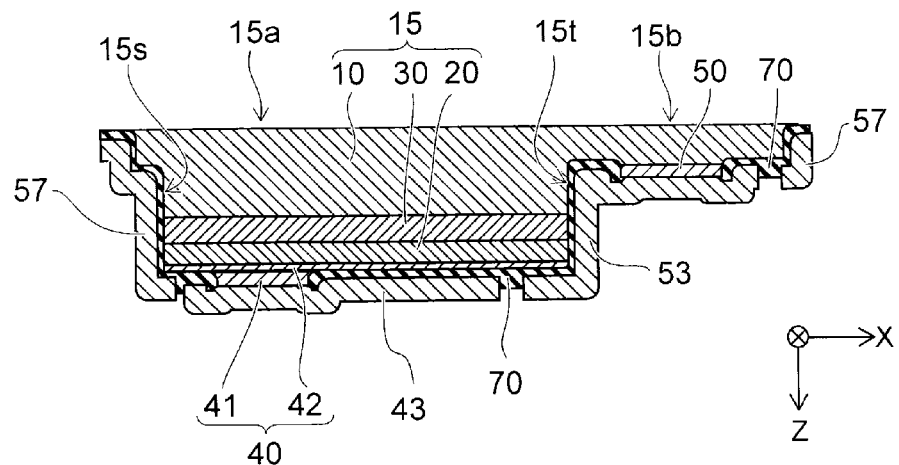

FIG. 2A and FIG. 2B are schematic views illustrating the configuration of the semiconductor light emitting device 100 according to the embodiment. In these drawings, the semiconductor light emitting device 100 in a state where the first pillar 45, the second pillar 55, and the sealing body 80 are removed is illustrated in order to describe the configuration of the first conversion electrode 43, the second conversion electrode 53, and the light blocking body 57. FIG. 2A is a plan view, and FIG. 2B is a cross-sectional view taken along line B-B of FIG. 2A.

As shown in FIG. 2A and FIG. 2B, in this example, the first conversion electrode 43 and the second conversion electrode 53 are provided on the second surface 15g side of the stacked body 15. The light blocking body 57 covers at least a part of the outer edge side surface 15s of the stacked body 15. The second conversion electrode 53 covers at least a part of a boundary side surface 15t between the first electrode 40 and the second electrode 50.

The insulating layer 70 covers the outer edge side surface 15s and a part of the second surface 15g of the stacked body 15. The insulating layer 70 further covers at least a part of the boundary side surface 15t. In this example, the insulating layer 70 covers the entire boundary side surface 15t. Thereby, the insulation between the first electrode 40 and the second electrode 50 is improved, and, for example, reliability can be improved.

The second conversion electrode 53 is provided so as to cover the portion between the first electrode 40 and the second electrode 50 via the insulating layer 70. The second conversion electrode 53 reflects light leaking from between the first electrode 40 and the second electrode 50. The light blocking body 57 is formed to cover at least a part of the side surface 15s at the outer edge, and at least a part of the boundary side surface 15t. Thereby, light leaking from the outer edge side surface 15s and the boundary side surface 15t can be reflected and extracted. Thereby, the light emission efficiency of the semiconductor light emitting device 100 can be improved.

The insulating layer 70 covers a part of the first electrode 40 and a part of the second electrode 50. Specifically, the insulating layer 70 covers portions of the first electrode 40 other than the portion connected to the first conversion electrode 43. The insulating layer 70 covers portions of the second electrode 50 other than the portion connected to the second conversion electrode 53.

The first conversion electrode 43 is formed to cover the insulating layer 70 and the contact portion of the first electrode 40. In addition, the second conversion electrode 53 is formed to cover the insulating layer 70 and the contact portion of the second electrode 50. A space is provided between the first conversion electrode 43 and the second conversion electrode 53 so as to electrically be insulated from each other.

In the semiconductor light emitting device 100 according to the embodiment, a part of the light emitted from the light emitting layer 30 is directly extracted from the first surface 15f to the outside. Another part of the emitted light propagates toward the first electrode 40, the second electrode 50 and the light blocking body 57, and is reflected by them. The reflected light may change a propagating direction thereof, and may be extracted from the first surface 15f. There is a part of the light propagating toward the space between the first electrode 40 and the second electrode 50, and reflected by the second conversion electrode 53. The light reflected by the second conversion electrode 53 may also propagate toward the first surface 15f, and may be extracted therefrom to the outside.

Accordingly, the semiconductor light emitting device 100 is configured such that most of the light emission in the light emitting layer 30 is extracted from the first surface 15f. That is, the light emission from other surfaces of the stacked body 15 is suppressed, and thereby, the light extraction efficiency is improved. Thus, the higher light output is achieved in the semiconductor light emitting device 100.

For example, a material with a high reflectance for the light emission in the light emitting layer 30, such as silver (Ag), is used for the p-side conductive layer 42. Also a light transmissive material, such as ITO, may be used for the p-side conductive layer 42. In this case, the light emitted from the light emitting layer 30 passes through the p-side conductive layer 42, is reflected at the first conversion electrode 43 and a part of the second conversion electrode 53, and propagates toward the first surface 15f. Thereby, the light extraction efficiency can be improved.

In the semiconductor light emitting device 100, the heat generated in the stacked body 15 is dissipated with good efficiency to the outside via the first conversion electrode 43 and the second conversion electrode 53, and further via the first pillar 45 and the second pillar 55 connected to them. Thereby, the temperature increase of the light emitting layer 30 can be suppressed to improve the light emission efficiency (internal quantum efficiency).

As illustrated in FIG. 1A and FIG. 2A, on the second surface 15g of the stacked body 15, the first conversion electrode 43 and the second conversion electrode 53 cover most of the first portion 15a of the stacked body 15 including the light emitting layer 30. Thereby, the heat of the stacked body 15 can be dissipated with superior efficiency.

As shown in FIG. 1B, the first pillar 45 is provided on the first portion 15a of the stacked body 15 via the first conversion electrode 43. The second pillar 55 covers a part of the first portion 15a of the stacked body 15 via the second conversion electrode 53. Thereby, the heat generated in the stacked body 15 is dissipated with good efficiency via both of the first pillar 45 and the second pillar 55.

Thus, in the semiconductor light emitting device 100 according to the embodiment, the extraction efficiency of light emission in the light emitting layer 30 and the internal quantum efficiency can be improved. Thereby, a semiconductor light emitting device 100 may have the higher light emission efficiency.

The light emitting layer 30 includes a plurality of well layers and a barrier layer provided between two adjacent well layers. That is, the light emitting layer 30 has a multi-quantum well (MQW) structure in which a plurality of well layers and a plurality of barrier layers are alternately stacked in the Z-axis direction.

The energy band gap of the well layer is smaller than the energy band gap of the barrier layer. In the well layer, a hole and an electron recombine to emit light.

The well layer includes, for example, a nitride semiconductor expressed by the composition formula $In_xGa_{1-x}N$ ($0<x<1$). The barrier layer includes, for example, gallium nitride (GaN). Also a nitride semiconductor expressed by the composition ratio $In_yGa_{1-y}N$ ($0<y<1$) may be used for the barrier layer, and the In composition ratio y in the barrier layer is smaller than the In composition ratio x in the well layer. The light emitting layer 30 thus configured emits light having a peak wavelength of not less than 350 nm and not more than 700 nm, for example.

In the embodiment, the configuration of the light emitting layer 30 is not limited to this example. For example, the light emitting layer 30 may be a single-quantum well (SQW) structure. In this case, the light emitting layer 30 includes two barrier layers and a well layer provided between them.

Figure 3B:
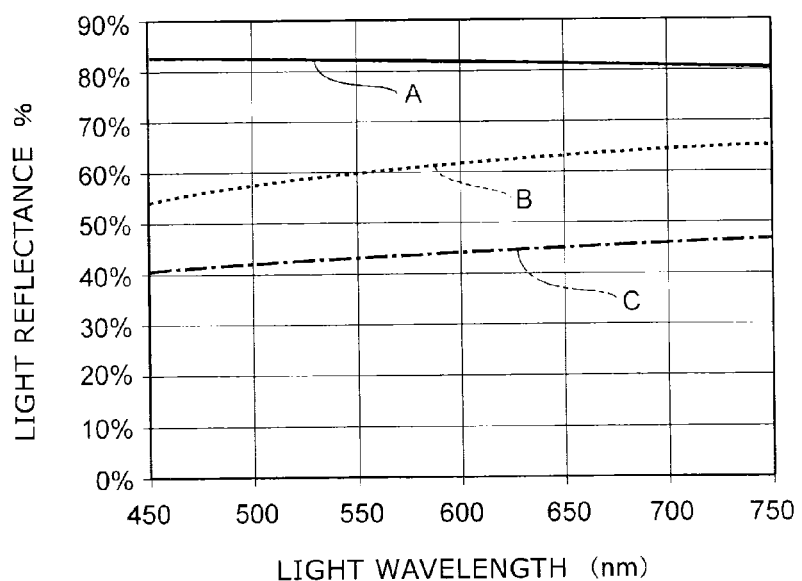
FIG. 3B is a graph showing the reflection characteristics of the conversion electrode.

FIG. 3A is a cross-sectional view illustrating the configuration of a part of the semiconductor light emitting device according to the embodiment. FIG. 3A shows the configuration of the conversion electrode 43 (53) and the pillar 45 (55). FIG. 3B is a graph showing the reflection characteristics of the conversion electrodes.

As shown in FIG. 3A, the seed layer 47, a plated layer 49, and the pillar 45 (55) are sequentially provided on the insulating layer 70. Each conversion electrode includes the seed layer 47 for passing a current in electroplating and the plated layer 49

The seed layer 47 may be a single metal layer or may have a stacked structure in which a plurality of metals are stacked. The seed layer 47 includes, in the surface in contact with the insulating layer 70, a material with a high reflectance in the light wavelength range of 400 nm to 700 nm, such as aluminum (Al) and an alloy thereof, silver (Ag) and an alloy thereof, platinum (Pt) and an alloy thereof, and nickel (Ni) and an alloy thereof.

FIG. 3B shows the reflectance of stacked structures formed on a grass plate. The reflectance is measured by using incident light on the glass plate side. Graph A shows a reflectance of a stacked structure, in which Al (100 nm) and titanium (Ti, 200 nm) are sequentially stacked on a glass plate. Graph B shows a reflectance of Ti/Al/Ti (5 nm/100 nm/200 nm) structure, and graph C shows a reflectance of a single-layer film of Ti (200 nm). The horizontal axis is the light wavelength, and the vertical axis is the reflectance.

As shown in graph A, when an Al film is in contact with a glass plate, the reflectance in the visible light range (light wavelength: 450 to 750 nm) is 80% or more. Graphs B and C show the reflectance when the Ti film is in contact with the glass plate, wherein the reflectance becomes lower than that in graph A. Graph B shows that the reflectance becomes lower, even when the stacked structure includes the Al film.

Figure 4:
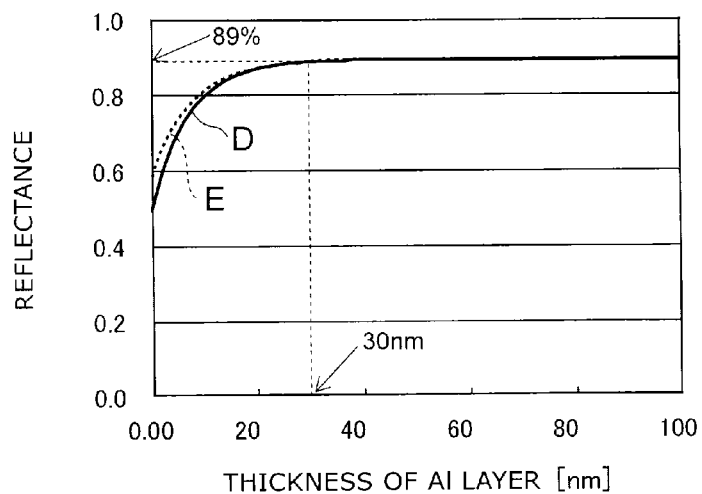
FIG. 4 is a graph illustrating the configuration of a part of the semiconductor light emitting device according to the embodiment.

FIG. 4 is a graph illustrating the configuration of a part of the semiconductor light emitting device according to the embodiment. The drawing shows the relationship between the thickness of the Al film included in the seed layer 47 and the reflectance of the Al film, for example. Graph D is the reflectance when light is perpendicularly incident on the Al film, and graph E is the reflectance when integrating over solid angle. As shown in the drawing, a reflectance of 89% or more is obtained when the thickness of the Al film is 30 nm or more.

Thus, the seed layer 47 preferably uses, for its surface in contact with the insulating layer 70, aluminum or an alloy thereof with a reflectance at light wavelengths ranging from 400 nm to 750 nm of 80% or more, or silver or an alloy thereof with a higher reflectance than aluminum. The seed layer 47 preferably includes, for example, an Al film with a thickness of 30 nm or more.

The thickness of the first conversion electrode 43 and the second conversion electrode 53 is set, for example, not less than 1 μm and not more than 100 μm. The thickness of each conversion electrode may be appropriately set in view of heat dissipation performance, electrical characteristics, and productivity.

The insulating layer 70 may include at least one of silicon oxide and silicon nitride. For the insulating layer 70, for example, an inorganic material such as $SiO_2$, SiN, phosphorus silicate glass (PSG), and boron phosphorus silicate glass (BPSG) may be used. The insulating layer 70 is formed by CVD, for example. The thickness of the insulating layer 70 is, for example, not less than 10 nm and not more than 10,000 nm and is preferably 400 nm. For the formation of the insulating layer 70, also vapor deposition, sputtering, or the like may be used as well as CVD.

Also a glass material such as organic SOG (spin on glass) and inorganic SOG may be used as the insulating layer 70. A methylsilsesquioxane film may be used as the organic SOG film, for example. A silsesquioxane hydride film may be used as the inorganic SOG film. A film formed by applying an alcohol solution of a silanol and performing heat treatment may be used as the inorganic SOG film, for example.

Also a low dielectric constant interlayer insulating film (low-k film) and the like may be used as the insulating layer 70. Furthermore, also a resin-based material such as a polyimide, polybenzoxazole (PBO), and a silicone-based material may be used as the insulating layer 70. In this case, the thickness of the insulating layer 70 is, for example, not less than 1000 nm and not more than 20,000 nm.

The reflectance of the insulating layer 70 is lower than the reflectance of the first conversion electrode 43 and the second conversion electrode 53, when a light transmissive material is used for the insulating layer 70, for example.

Any conductive material may be used for the p-side conductive layer 42. The p-side conductive layer 42 serves as a contact electrode to the second semiconductor layer 20.

As the p-side conductive layer 42, a film containing at least one of Ni, Au, Ag, Al, and Pd may be used, for example.

As the p-side conductive layer 42, a stacked film including at least two selected from a Ni film, a Au film, a Ag film, an Al film, and a Pd film may be used. Preferably one of a Ag film, an Al film, and a Pd film, or a stacked film including at least two of a Ag film, an Al film, and a Pd film is used as the p-side conductive layer 42. Thereby, a high reflectance is obtained in the shorter wavelength region (ultraviolet light to blue light). Thereby, a high light extraction efficiency is obtained.

A light transmissive metal oxide may be used as the p-side conductive layer 42. For example, at least one of ITO (indium tin oxide), $SnO_2$, $In_2O_3$, and ZnO may be used as the p-side conductive layer 42.

Sputtering, vapor deposition, and the like may be used for the formation of the p-side conductive layer 42, for example. When the p-side conductive layer 42 is a single layer, the thickness of the p-side conductive layer 42 is, for example, 0.2 μm.

For the p-side electrode 41 and the second electrode 50, a stacked film of a Ni film and a Au film may be used, for example. At this time, the thickness of the Ni film is about 100 nm, for example, and the thickness of the Au film is, for example, about 100 nm. Alternatively, a stacked film of a Ti film, a Ni film, and a Au film may be used as the p-side electrode 41 and the second electrode 50, for example. At this time, the thickness of the Ti film is, for example, 50 nm; the thickness of the Ni film is, for example, about 100 nm; and the thickness of the Au film is, for example, about 100 nm.

The material, the thickness, and the configuration of the p-side electrode 41 are preferably the same as the material, the thickness, and the configuration of the second electrode 50. Sputtering and vapor deposition may be used for forming the p-side electrode 41 and the second electrode 50, for example.

For the sealing body 80, an insulating resin such as an epoxy resin may be used, for example. The sealing body 80 may include, for example, a quartz filler, an alumina filler, or the like. By including these fillers, the sealing body 80 has improved thermal conductivity and enables heat dissipation performance to be improved.

The sealing body 80 may include, for example, a filler containing at least one selected from the group consisting of ZnO, $TiO_2$, $ZrO_2$, $Al_2O_3$, MgO, $CaTiO_2$, $BaSO_4$, ZnS, and $CaCO_3$. Thereby, the reflectance of the sealing body 80 is enhanced, and leakage light from surfaces other than the first surface 15f of the stacked body 15 can be further suppressed.

The filler that improves thermal conductivity and the filler that improves the reflectance mentioned above may be mixed for use. However, the embodiment is not limited thereto, and any insulating material may be used for the sealing body 80. Furthermore, a filler may not be included.

Figure 5:
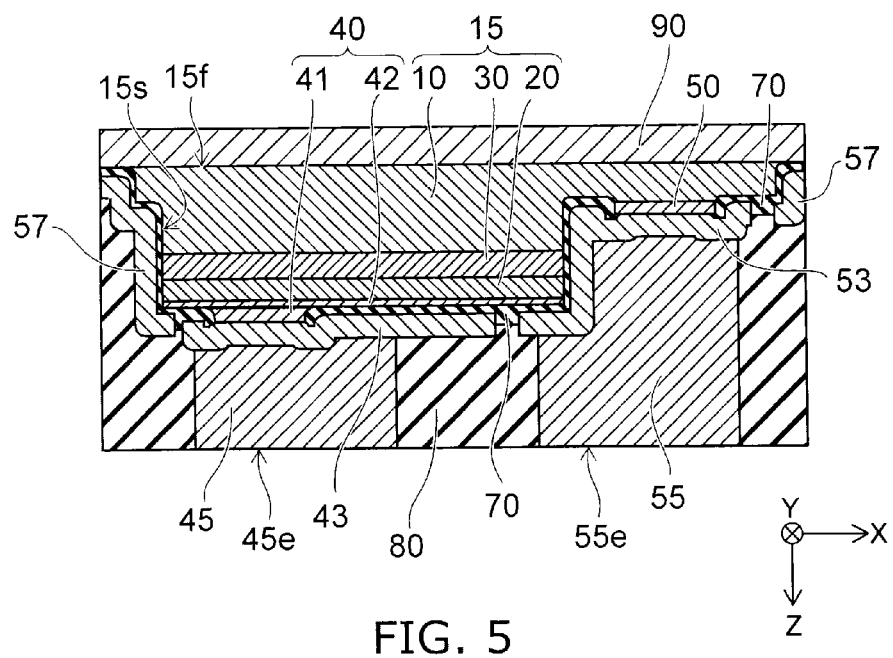
FIG. 5 is a schematic cross-sectional view illustrating the configuration of a semiconductor light emitting device according to a variation of the embodiment.

FIG. 5 is a schematic cross-sectional view illustrating the configuration of a semiconductor light emitting device 110 according to a variation of the embodiment. The semiconductor light emitting device 110 according to the embodiment further includes a wavelength conversion layer 90. Other components and the combination thereof are the same as those of the semiconductor light emitting device 100.

The wavelength conversion layer 90 is provided on at least a part of the first surface 15f of the stacked body 15. The wavelength conversion layer 90 absorbs a part of the light emission in the light emitting layer 30, and emits light with a wavelength different therefrom. For example, the wavelength conversion layer 90 includes, for example, a fluorescent substance. The fluorescent substance included in the wavelength conversion layer 90 may include a plurality of fluorescent substances that emit lights of wavelengths different from one another. The wavelength conversion layer 90 may be a structure in which a plurality of fluorescent layers individually including different types of fluorescent substances are stacked. For example, the light emitted from the light emitting layer 30 is ultraviolet light, violet light, or blue light, and the light emitted from the fluorescent substance is yellow light or red light. The mixed lights emitted from the wavelength conversion layer 90 (converted light) and the light emitting layer 30 make white light, for example.

In this example, the wavelength conversion layer 90 covers the entire first surface 15f. The embodiment is not limited thereto, and a part of the first surface 15f may not be covered with the wavelength conversion layer 90.

A method for manufacturing a semiconductor light emitting device according to the embodiment will now be described with reference to FIG. 6A to FIG. 9C. FIG. 6A to FIG. 9C are schematic cross-sectional views showing an example of the manufacturing process of the semiconductor light emitting device 110. In this example, a plurality of semiconductor light emitting devices 110 are collectively formed in one wafer.

Figure 6A:
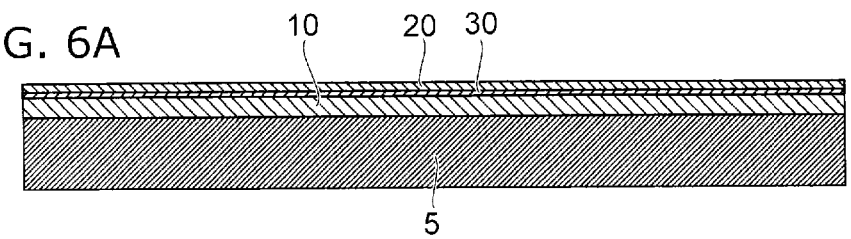
FIG. 6A to FIG. 9C are schematic cross-sectional views illustrating a manufacturing process of the semiconductor light emitting device according to the embodiment.

FIG. 6A is a cross-sectional view showing the first semiconductor layer 10, the second semiconductor layer 20, and the light emitting layer 30 formed on a substrate 5. The first semiconductor layer 10, the light emitting layer 30, and the second semiconductor layer 20 are caused to grow sequentially on the substrate 5 using the MOCVD (metal organic chemical vapor deposition) method, for example. The substrate 5 is a silicon substrate, for example. Also a sapphire substrate may be used as the substrate 5. The first semiconductor layer 10, the light emitting layer 30, and the second semiconductor layer 20 are, for example, a nitride semiconductor and contain gallium nitride (GaN).

The first semiconductor layer 10 is an n-type GaN layer, for example. The first semiconductor layer 10 may have a stacked structure including a buffer layer provided on the substrate 5 and an n-type GaN layer provided on the buffer layer. The second semiconductor layer 20 includes, for example, a p-type AlGaN layer provided on the light emitting layer 30 and a p-type GaN layer provided on the p-type AlGaN layer, for example.

Figure 6B:
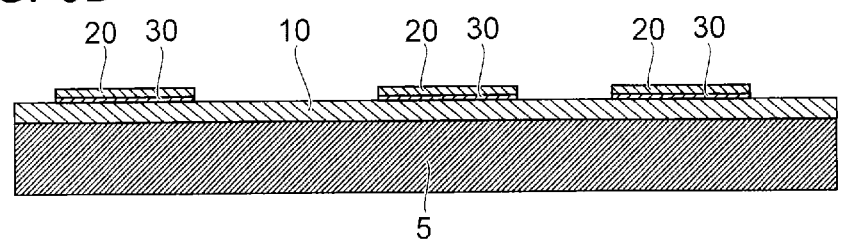

FIG. 6B shows a state where the second semiconductor layer 20 and the light emitting layer 30 are selectively removed to expose the first semiconductor layer 10. For example, a not-shown etching mask is used to selectively etch the second semiconductor layer 20 and the light emitting layer 30 to expose the first semiconductor layer 10. The RIE (reactive ion etching) method is used for the etching of the second semiconductor layer 20 and the light emitting layer 30, for example.

Figure 6C:
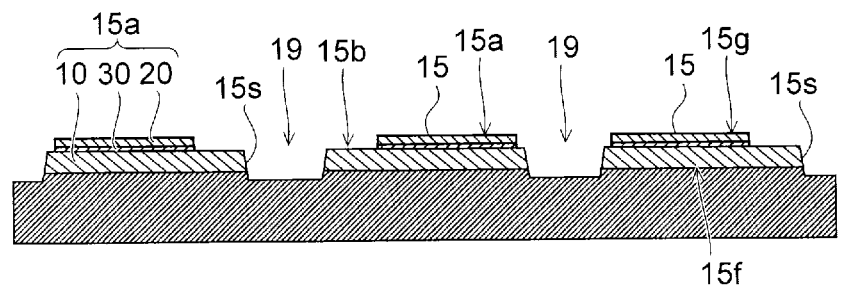

Next, as shown in FIG. 6C, the first semiconductor layer 10 is selectively removed to form a plurality of stacked bodies 15 on the substrate 5. For example, an etching mask (not shown) that covers the second semiconductor layer 20 and the light emitting layer 30 is provided on the first semiconductor layer 10. Subsequently, the RIE method is used to etch the first semiconductor layer 10 to form trenches 19 with a depth reaching the substrate 5. The trench 19 is formed deeper than the first surface 15f by etching the substrate 5. It is also possible to form the trench 19 after forming the first electrode 40 and the second electrode 50. The outer edge side surface 15s of the stacked body 15, which is the sidewall of the trench 19, is made a tapered shape inclined such that the stacked body 15 on the second surface 15g side is narrower, for example. The area of the stacked body 15 on the second surface 15g side is preferably smaller that on the first surface 15f.

As shown in FIG. 6C, the first surface 15f of the stacked body 15 is the surface in contact with the substrate 5, and the second surface 15g is the surfaces of the first semiconductor layer 10 and the second semiconductor layer 20.

Figure 6D:
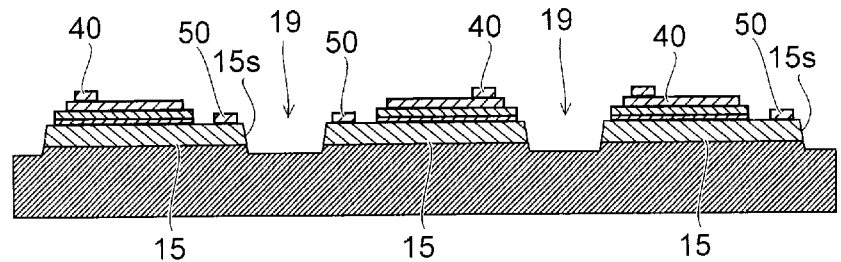

Next, as shown in FIG. 6D, the first electrode 40 and the second electrode 50 are formed on the second surface 15g of the stacked body 15. The first electrode 40 is formed on the second semiconductor layer 20. The second electrode 50 is formed on the first semiconductor layer 10. The first electrode 40 is formed so as to have a larger area than the second electrode 50.

The first electrode 40 and the second electrode 50 are formed by the sputtering method, the vapor deposition method, or the like, for example. Either of the first electrode 40 and the second electrode 50 may be formed earlier, or both may be formed simultaneously using the same material.

Figure 7A:
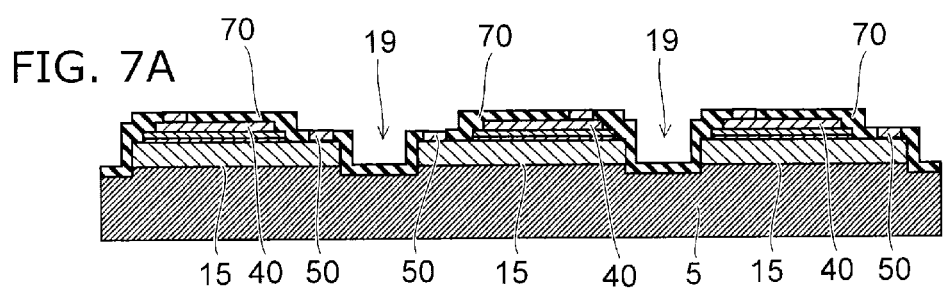

Next, as shown in FIG. 7A, the insulating layer 70 that covers the stacked body 15 is formed on the substrate 5. An opening leading to the first electrode 40 provided on the stacked body 15 and an opening leading to the second electrode 50 are formed in the insulating layer 70.

Figure 7B:
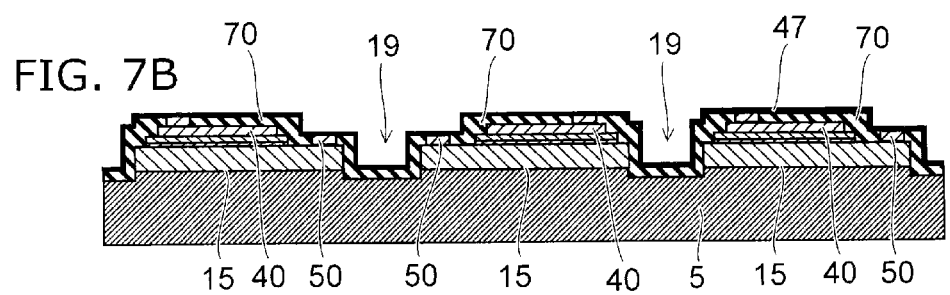

Next, as shown in FIG. 7B, a metal film (the seed layer 47) is formed on the insulating layer 70. The seed layer 47 covers the first electrode 40 and the second electrode 50 exposed at the openings of the insulating layer 70. The seed layer 47 preferably includes, at the surface in contact with the insulating layer 70, for example, a member with a reflectance of 80% or more for the light emission of the light emitting layer 30.

Figure 7C:
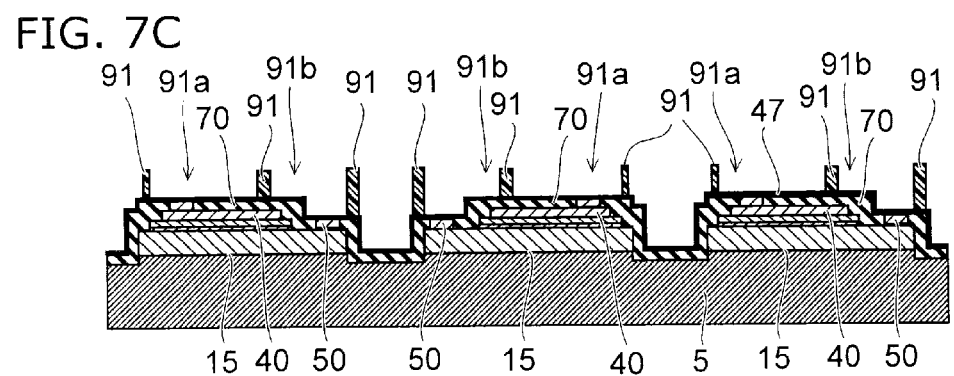

Next, as shown in FIG. 7C, a resist mask 91 is formed on the seed layer 47. The resist mask 91 includes openings 91a and openings 91b. The opening 91a is provided on the first electrode 40, and the opening 91b is provided on the second electrode 50.

Figure 7D:
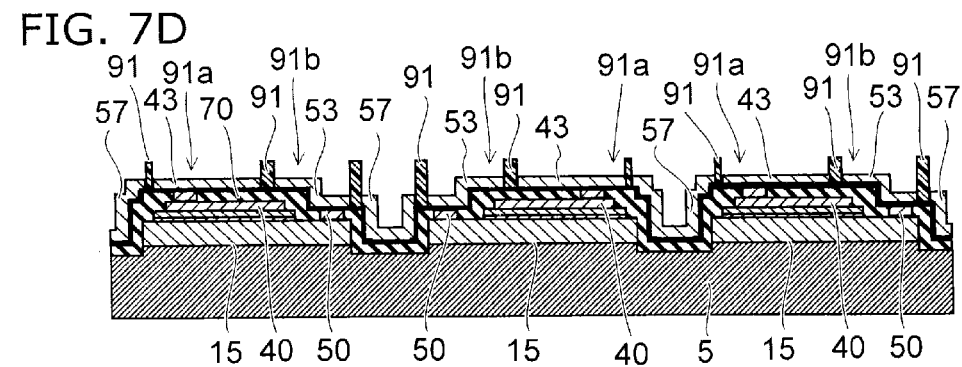

Subsequently, as shown in FIG. 7D, electroplating is used to form the first conversion electrode 43, the second conversion electrode 53, and the light blocking body 57 covering the inner surface of the trench 19. That is, the seed layer 47 is used as a current path to perform plating to form copper (Cu), for example, in the openings 91a and 91b of the resist mask 91 and in the trench 19; thus, the first conversion electrode 43, the second conversion electrode 53, and the light blocking body 57 are selectively formed.

The first conversion electrode 43 is electrically connected to the first electrode 40 via the opening of the insulating layer 70. The second conversion electrode 53 is electrically connected to the second electrode 50 via the opening of the insulating layer 70.

Figure 8A:
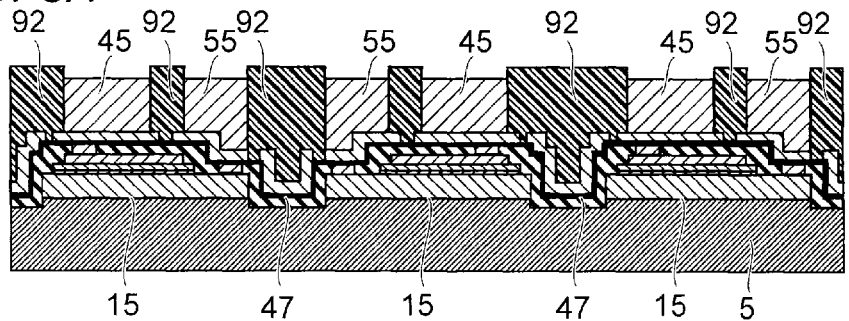

Next, as shown in FIG. 8A, a resist mask 92 having openings 92a and openings 92b is formed. For example, after the resist mask 91 is removed using a solvent or oxygen plasma, a resist mask 91 is newly formed using photolithography. It is also possible to form the resist mask 92 on the resist mask 91 in a stacked manner.

Subsequently, as shown in FIG. 8A, the first pillar 45 and the second pillar 55 are formed in the openings 92a and 92b, respectively. The first pillar 45 and the second pillar 55 are formed, for example, using electroplating. The first pillar 45 and the second pillar 55 are formed, for example, by copper plating.

Figure 8B:
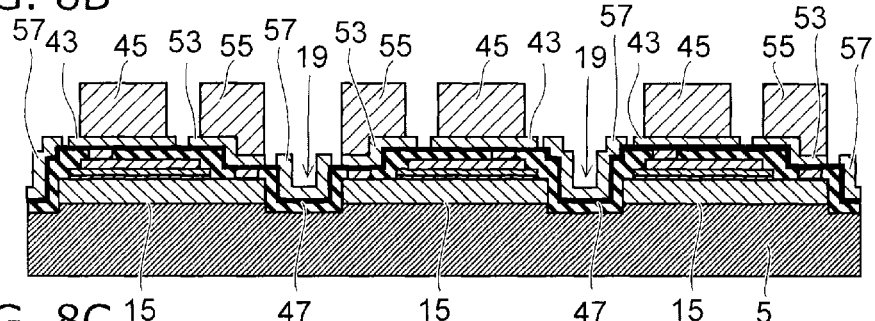
Figure 8C:
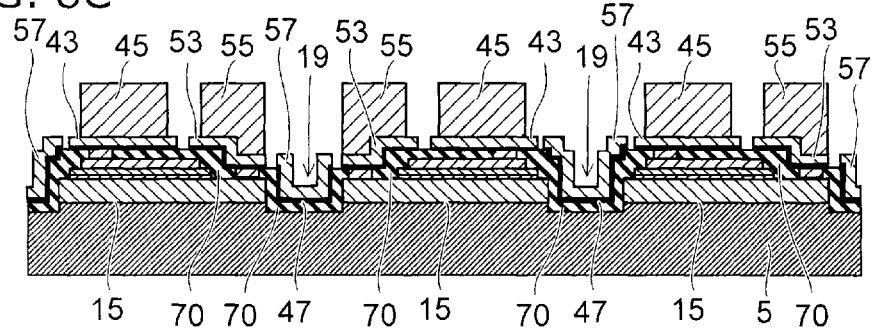

Subsequently, as shown in FIG. 8B, the resist mask 92 is removed, for example, using a solvent or oxygen plasma. Subsequently, as shown in FIG. 8C, the first pillar 45, the second pillar 55, the first conversion electrode 43, and the second conversion electrode 53 are used as a mask to perform wet etching to remove the exposed portion of the seed layer 47. Thereby, the electrical connection between the first conversion electrode 43 and the second conversion electrode 53 is cut.

Figure 8D:
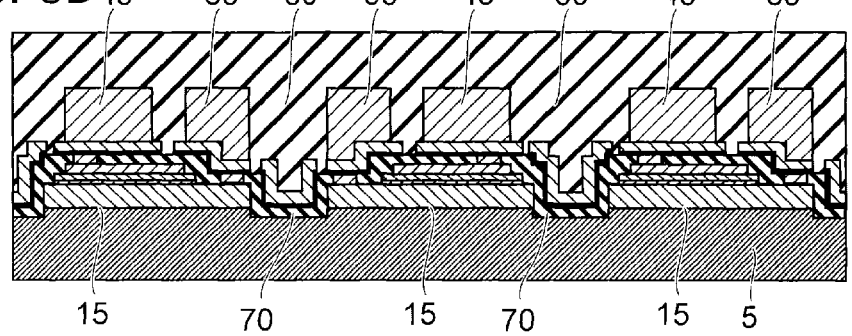

Next, as shown in FIG. 8D, the sealing body 80 that covers the upper side of the insulating layer 70, the first pillar 45, and the second pillar 55 is formed. The sealing body 80 contains, for example, carbon black, and blocks the light emitted from the light emitting layer 30. The sealing body 80 may include a member that reflects the light emitted from the light emitting layer 30, for example, such as titanium oxide.

Figure 9A:
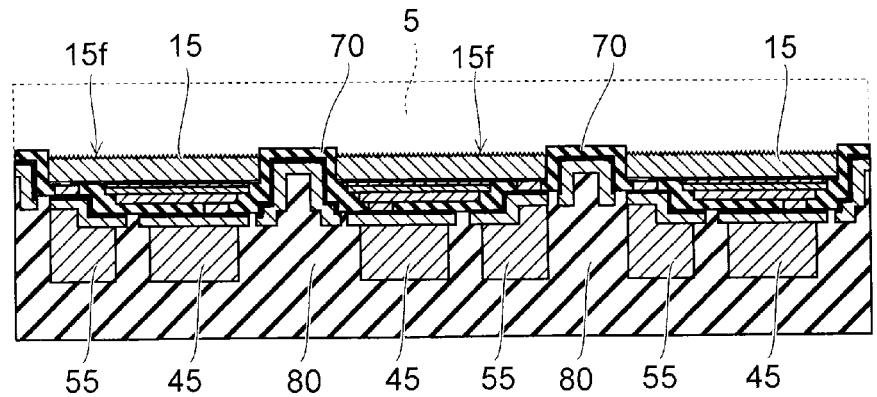
Figure 9B:
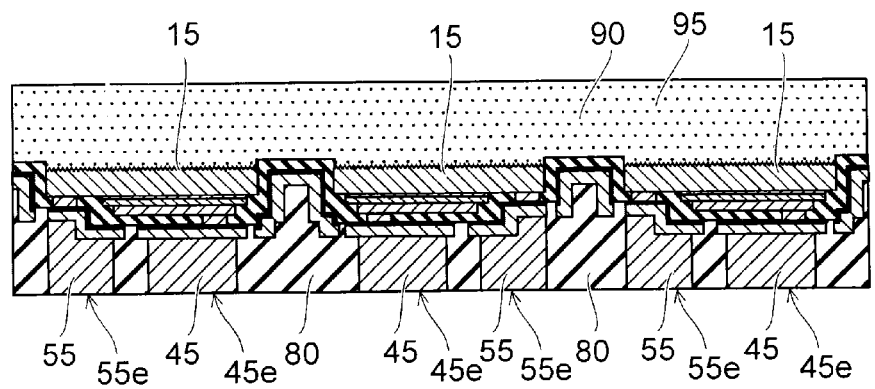
Figure 9C:
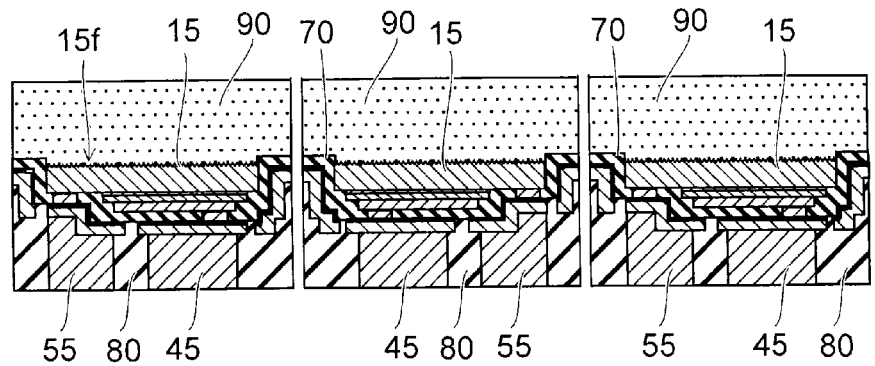

As shown in FIG. 9A, the substrate 5 is removed from the stacked body 15. FIGS. 9A to 9C are cross-sectional views illustrating the stacked body 15 and the sealing body 80 so as to be upside down view of FIG. 8D.

When using a silicon substrate, selectively removing the substrate 5 by using wet etching becomes possible, for example. When the substrate 5 is a sapphire substrate, the substrate 5 may be removed, for example, by using the laser lift-off method.

Next, fine protrusions are formed on the first surface 15f of the stacked body 15. The first semiconductor layer 10 is wet-etched, for example, using a KOH (potassium hydroxide) aqueous solution, TMAH (tetramethylammonium hydroxide), or the like. In this process, a difference in etching rate depending on the crystal plane orientation makes the fine protrusions in the first surface 15f as shown in FIG. 9A. It is also possible to form the fine protrusions using a resist mask provided on the first surface 15f. The fine protrusions provided in the first surface 15f may improve the extraction efficiency of the light emitted from the light emitting layer 30.

Next, as shown in FIG. 9B, the wavelength conversion layer 90 is formed on the first surface 15f. The wavelength conversion layer 90 is a resin layer in which a fluorescent substance 95 is dispersed, for example. The wavelength conversion layer 90 is formed, for example, using a method such as printing, potting, molding, and compression molding.

Subsequently, on the second surface 15g side of the stacked body 15, the surface of the sealing body 80 is ground to expose the ends of the first pillar 45 and the second pillar 55. The end 45e of the first pillar 45 functions as a p-side external terminal, for example, and the end 55e of the second pillar 55 functions as an n-side external terminal, for example.

Next, as shown in FIG. 9C, the wavelength conversion layer 90, the insulating layer 70, and the sealing body 80 are cut between adjacent stacked bodies 15. Thereby, the semiconductor light emitting device 100 including the stacked body 15 is fragmented. The cutting of the wavelength conversion layer 90, the insulating layer 70, and the sealing body 80 is performed using a dicing blade, for example. Laser irradiation may also be used for the cutting.

Figure 10A:
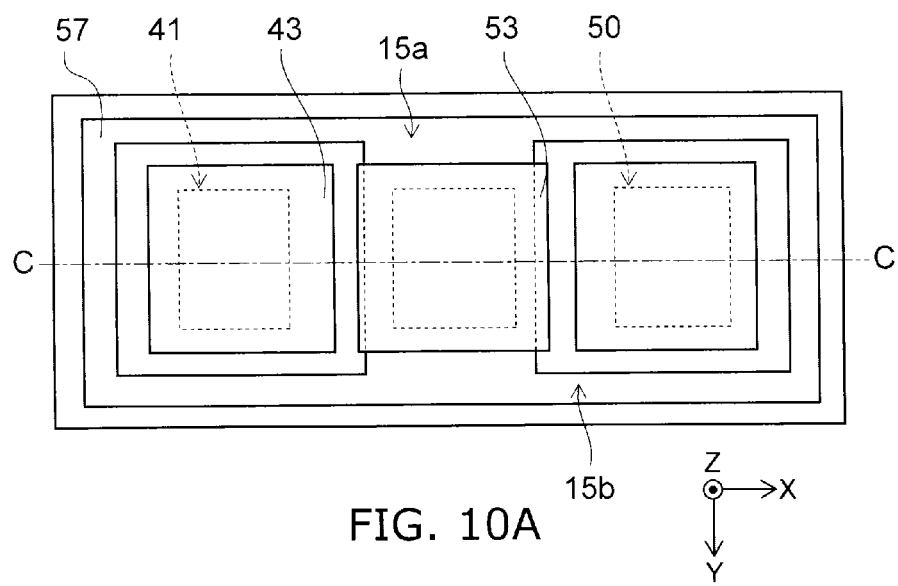
FIG. 10A and FIG. 10B are schematic cross-sectional views illustrating a semiconductor light emitting device according to another variation of the embodiment.
Figure 10B:
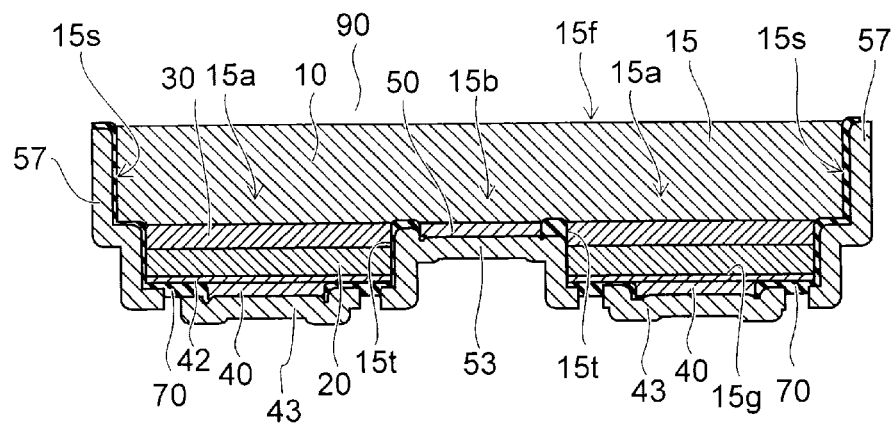

Next, a semiconductor light emitting device 120 according to another variation of the embodiment is described with reference to FIG. 10. FIG. 10A and FIG. 10B are schematic views illustrating the configuration of the semiconductor light emitting device 120 according to the embodiment. In these drawings, the semiconductor light emitting device 120 in a state where the first pillar 45, the second pillar 55, and the sealing body 80 are removed is illustrated in order to describe the configuration of the first conversion electrode 43, the second conversion electrode 53, and the light blocking body 57. FIG. 10A is a plan view, and FIG. 10B is a cross-sectional view taken along line C-C of FIG. 10A.

In this example, the second electrode 50 is provided at the center of the stacked body 15. That is, the second portion 15b is provided in a central portion in the X-direction of the stacked body 15, and the first portion 15a is provided on both sides of the second portion 15b.

The insulating layer 70 covers the outer edge side surface 15s and a part of the second surface 15g of the stacked body 15. The insulating layer 70 further covers at least a part of the boundary side surface 15t between the first portion 15a and the second portion 15b. In this example, the insulating layer 70 covers the entire boundary side surface 15t.

The first conversion electrode 43 and the second conversion electrode 53 are provided on the second surface 15g side of the stacked body 15. The first conversion electrode 43 is formed so as to cover the first electrodes 40 on the second surface side of the two first portions 15a. The second conversion electrode 53 is provided on the second surface side of the second portion 15b, and extends across the boundary side surface 15t to the first portion 15a side.

The light blocking body 57 covers at least a part of the outer edge side surface 15s of the stacked body 15. The second conversion electrode 53 covers at least a part of the boundary side surface 15t between the first electrode 40 and the second electrode 50.

The second conversion electrode 53 is provided so as to cover the spaces between the two first electrodes 40 and the second electrode 50 provided between them. The second conversion electrode 53 reflects light leaking from between the first electrode 40 and the second electrode 50. The light blocking body 57 is formed so as to cover at least a part of the outer edge side surface 15s. Thereby, light leaking from the outer edge side surface 15s and the boundary side surface 15t can be reflected and extracted. Thereby, the light emission efficiency of the semiconductor light emitting device 120 can be improved.

The "nitride semiconductor" referred to herein includes group III-V compound semiconductors of $B_xIn_yAl_zGa_{1-x-y}N$ ($0 \leq x \leq 1$, $0 \leq y \leq 1$, $0 \leq z \leq 1$, $0 \leq x+y+z \leq 1$), and also includes mixed crystals containing a group V element besides N (nitrogen), such as phosphorus (P) and arsenic (As). Furthermore, the "nitride semiconductor" also includes those further containing various elements added to control various material properties such as conductivity type, and those further containing various unintended elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a stacked body including a first semiconductor layer of a first conductivity type, a second semiconductor layer of a second conductivity type and a light emitting layer provided between the first semiconductor layer and the second semiconductor layer:
      a first portion of the stacked body including:
         a part of the first semiconductor layer of a first conductivity type;
         the light emitting layer provided on the part of the first semiconductor layer; and
         the second semiconductor layer provided on the light emitting layer; and
      a second portion of the stacked body provided next to the first portion and including another part of the first semiconductor layer;
   a first electrode provided on the first portion;
   a second electrode provided on the second portion on the same side of the stacked body as the first electrode provided;
   an insulating layer covering the stacked body on the side where the first electrode and the second electrode are provided, the insulating layer covering a side surface around the stacked body;
   a first conversion electrode provided on the insulating layer and electrically connected to the first electrode;
   a second conversion electrode provided next to the first conversion electrode on the insulating layer and electrically connected to the second electrode; and
   a light blocking body provided on the side surface of the stacking body via the insulating layer, and surrounding the first conversion electrode and the second conversion electrode,
   the first conversion electrode, the second conversion electrode, and the light blocking body including, in a portion contacting with the insulating layer, a member having a reflectance of 80 percent or more for light emitted from the light emitting layer.

2. The device according to claim 1, wherein the second conversion electrode extends on the insulating layer from the second portion to the first portion, and covers a side surface of the light emitting layer and a side surface of the second semiconductor layer located between the first portion and the second portion.

3. The device according to claim 1, wherein the first conversion electrode, the second conversion electrode and the light blocking body include a first metal layer of aluminum contacting with the insulating layer, and a second metal layer provided on the first metal layer.

4. The device according to claim 3, wherein the first metal layer has a thickness of 30 nm or more.

5. The device according to claim 1, wherein the light blocking body is electrically connected to one of the first conversion electrode and the second conversion electrode.

6. The device according to claim 1, wherein the light blocking body is not electrically connected to either one of the first conversion electrode and the second conversion electrode.

7. The device according to claim 1, wherein the side surface of the stacked body inclines so that the first semiconductor layer has a smaller area on the light emitting layer side than on a side opposite thereto.

8. The device according to claim 1, wherein the first electrode includes at least one of Ni, Au, Ag, Al, and Pd.

9. The device according to claim 1, wherein the first electrode has a stacked structure including at least two of a Ag film, an Al film, and a Pd film.

10. The device according to claim 1, wherein the first electrode includes a metal oxide that transmits light emitted from the light emitting layer.

11. The device according to claim 1, wherein the first electrode includes one of ITO (indium tin oxide), $SnO_2$, $In_2O_3$, and ZnO.

12. The device according to claim 1, wherein the light emitting layer emits light having a peak wavelength of not less than 350 nanometers and not more than 700 nanometers.

13. The device according to claim 1, wherein the first conversion electrode, the second conversion electrode, and the light blocking body include a first metal layer of silver contacting with the insulating layer, and a second metal layer provided on the first metal layer.

14. The device according to claim 1, wherein the first conversion electrode and the second conversion electrode have a thickness of not less than 1 micrometer and not more than 100 micrometers.

15. The device according to claim 1, wherein the insulating layer includes an inorganic material.

16. The device according to claim 1, wherein the insulating layer includes at least one of silicon oxide and silicon nitride.

17. The device according to claim 1, wherein the second conversion electrode covers a space between the first electrode and the second electrode via the insulating layer.

18. The device according to claim 1, further comprising:
   a first pillar provided on the first conversion electrode, and extending in a first direction from the first semiconductor layer toward the second semiconductor layer;
   a second pillar provided on the second conversion electrode, and extending in the first direction; and
   a sealing body covering the stacked body, the first pillar, and the second pillar, an end of the first pillar and an end of the second pillar being exposed in the sealing body,
   wherein the first conversion electrode has a portion provided between the first electrode and the first pillar, and the second conversion electrode has a portion provided between the second electrode and the second pillar.

19. The device according to claim 18, wherein
   the sealing body includes a filler and
   the filler includes at least one selected from the group consisting of ZnO, $TiO_2$, $ZrO_2$, $Al_2O_3$, MgO, $CaTiO_2$, $BaSO_4$, ZnS, and $CaCO_3$.

20. The device according to claim 1, further comprising a wavelength conversion layer provided on a side of the stacked body opposite to the first electrode and the second electrode.

* * * * *